United States Patent
Couble et al.

[11] Patent Number: 5,169,692
[45] Date of Patent: Dec. 8, 1992

[54] TIN LEAD PROCESS

[75] Inventors: Edward C. Couble, Brockton; Steven M. Florio, Hopkinton; Richard F. Staniunas, Northboro, all of Mass.

[73] Assignee: Shipley Company Inc., Newton, Mass.

[21] Appl. No.: 794,479

[22] Filed: Nov. 19, 1991

[51] Int. Cl.$^5$ .......................... B05D 1/18; C23C 18/16
[52] U.S. Cl. .................................. 427/436; 106/1.22; 106/1.25
[58] Field of Search ..................... 106/1.25, 1.22; 427/436, 437

[56] References Cited

U.S. PATENT DOCUMENTS

| | | | |
|---|---|---|---|
| Re. 30,434 | 11/1980 | Davis | 427/437 |
| 4,027,055 | 5/1977 | Schneble, Jr. | 427/437 |
| 4,194,913 | 3/1980 | Davis | 106/1.22 |
| 4,234,631 | 11/1980 | Davis | 427/436 |
| 4,715,894 | 12/1987 | Holtzman et al. | 106/1.22 |
| 4,816,070 | 3/1989 | Holtzman et al. | 106/1.22 |
| 4,822,202 | 11/1989 | Holtzman et al. | 106/1.22 |

FOREIGN PATENT DOCUMENTS

| | | |
|---|---|---|
| 0180265 | 5/1986 | European Pat. Off. |
| 3322156 | 1/1985 | Fed. Rep. of Germany |
| 3800819 | 7/1989 | Fed. Rep. of Germany |
| 1369023 | 8/1963 | France .................. 427/437 |
| 49-64527 | 6/1974 | Japan |
| 50-015741 | 2/1975 | Japan |
| 50-057927 | 5/1975 | Japan |
| 59-211565 | 11/1984 | Japan |
| 455171 | 4/1975 | U.S.S.R. .................. 427/437 |

OTHER PUBLICATIONS

Clark, "Handbook of Printed Circuit Manufacturing", Appendix F, 1985, Van Nostrand Rheinhold Co.

Primary Examiner—William R. Dixon, Jr.
Assistant Examiner—Margaret Einsmann
Attorney, Agent, or Firm—Robert L. Goldberg

[57] ABSTRACT

A process for replenishing a tin-lead alloy displacement plating solution which comprises periodically adding complexing agent to the solution during use of the same to bring the total concentration of complexing agent to an amount sufficient to ensure adhesion of the deposit to its underlying substrate.

14 Claims, 1 Drawing Sheet

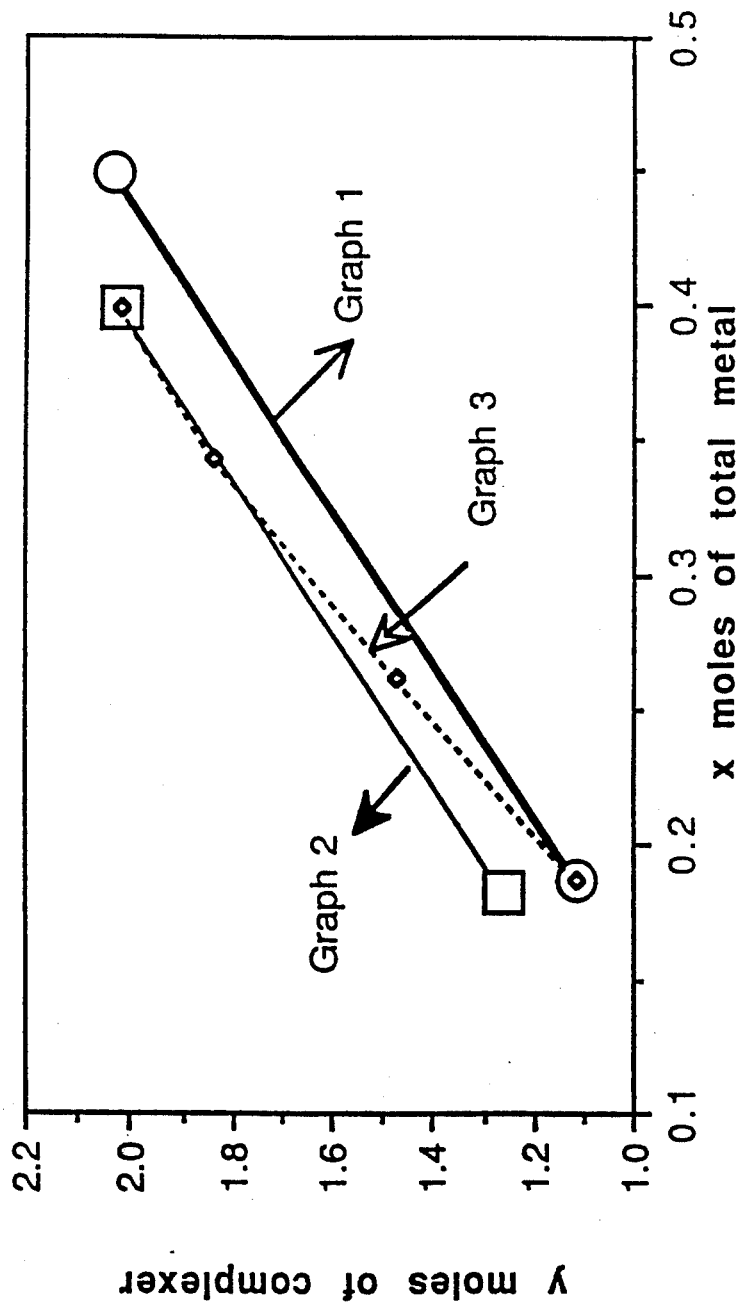

TIN LEAD PROCESS

BACKGROUND OF THE INVENTION

1. Introduction

This invention relates to immersion tin-lead alloy deposition and more particularly, to replenishment of an immersion tin-lead depositing solution during use of the solution to maximize adhesion between the deposit and an underlying substrate. The invention is especially useful for the manufacture of printed circuit boards.

2. Description of the Prior Art

Tin-lead alloy having a composition of between 60 and 65 percent tin and 35 to 40 percent lead (solder) is coated onto copper traces in the manufacture of printed circuit boards. The alloy may function as an etch resist and permits attachment of components to a circuit board. For this latter use, the alloy must melt and reflow at a reasonably low temperature to avoid damage to the circuit during heating of the board and must have an adequate thickness for surface mounting of components.

Conceptually, there are four methods available for coating tin-lead alloys onto copper traces in printed circuit manufacture. These methods include (1) hot air leveling, (2) electroless plating, (3) immersion plating and (4) electroplating. Each process has advantages and disadvantages and the metal deposit obtained from each differs from the deposit obtained by other plating methods.

Electrolytic plating of tin-lead alloys is a method of choice but suffers certain disadvantages. For example, a circuit board must be racked as part of an electrolytic cell which is labor intensive. Throwing power of the electrolytic bath does not provide desired uniformity with deposits of uneven thickness obtained, especially where high aspect ratio through-holes are encountered. Deposits of a 60/40 percent tin-lead alloy require close control of the solution composition and operating conditions of the electrolytic cell. Finally, damaged circuits are not easily reworked because electrolytic deposition cannot take place over a discontinuous conductive substrate.

Hot air leveling is conventionally used to provide a tin-lead deposit over copper circuits. In this process, the circuit board is floated or immersed in a molten solder bath. The coating obtained is not uniform but is made more uniform by passing the board with the solder coating beneath a hot air stream to level the coating. Even with the hot air stream, the coating formed is thin at the heel of the hole and uneven and thin in the center of the hole when high aspect ratio holes are plated.

Electroless plating baths for each of tin and lead are known but a publication showing electroless codeposition of tin and lead is not known. It is believed that electroless solder plating baths are difficult to formulate because an autocatalytic solution would contain a mixture of tin and lead as well as a complexing agent and reducing agent in a single plating solution.

Immersion plating is an electroless plating process, but is separately classified because deposition is by displacement of elemental metal from a substrate by metal ions in a plating solution. In contrast, in electroless plating, plating takes place primarily by autocatalytic reduction of metal ions from solution.

Since immersion plating is by displacement, immersion plating is an electrochemical reaction dependent upon the position the substrate metal occupies in the electromotive series relative to the metal to be deposited from solution. Plating occurs when the metal from a dissolved metal salt is displaced by a more active (less noble) metal immersed in the solution. When tin and lead are complexed under acidic conditions, the electropotentials of the tin and lead complexes relative to copper make immersion plating possible. However, limitations in the use of immersion plating for circuit fabrication exist. These include a slow plating rate, difficulty in obtaining a desired alloy and limited deposit thickness. Limited thickness is due to the plating reaction being self limiting because as the coating builds, the metal deposited from solution masks the underlying base metal required for displacement. Additionally, as the displaced base metal is dissolved in solution, it becomes a contaminant progressively slowing the rate of displacement. Typical deposit thickness for an immersion tin deposit in the prior art is 50 to 100 microinches, mainly because of the foregoing problems.

Absent the above disadvantages, there are advantages to immersion plating compared to other methods for depositing tin-lead alloy in circuit manufacture. For example, compared to electroplating, there is no hydrogen generation during the plating process thus avoiding pitting and discontinuities in the deposit. Also, immersion plating is not subject to surface roughness as found in electroplating processes due to "drag-over" from precleaners, anode corrosion and the like. In immersion plating, spontaneous plating is not a problem as would likely be encountered with autocatalytic plating. Moreover, with immersion plating, neither an electrically continuous circuit nor attachments of electrical contacts are required nor is there a need to maintain a precise current. Finally, immersion deposits are conformal in nature and conform to the topography of the substrate over which they are plated.

Despite the potential advantages of immersion plating, the prior art dismissed immersion plating processes for printed circuit fabrication because it was believed that thick, bondable (solderable) deposits were unavailable. As stated in *Printed and Integrated Circuitry*, McGraw Hill Book Company, Inc., New York, 1963 at page 138, immersion deposits are "limited in thickness, porous, and often poorly adherent and, therefore, of limited interest." The self limiting feature of immersion tin and lead plating was believed to make soldering impossible and consequently, plating baths for immersion deposits of tin and lead were of minimal interest to the art.

In U.S. Pat. No. 4,194,913, incorporated herein by reference, an immersion plating composition is disclosed for deposition of tin-lead alloys. In accordance with the teachings of this patent, an immersion plating solution is disclosed comprising stannous chloride, lead chloride, sodium hypophosphite, thiourea, hydrochloric acid and gelatin. In this patent, patentee states that the plating composition provides a faster plating rate and a deposit of increased thickness. Though it is believed that improved immersion deposits are obtained using the compositions of the patent, it is believed that the deposits are unsuitable for the commercial manufacture of printed circuit boards.

In European published application No. 0 167 949, also incorporated herein by reference, an immersion plating solution is disclosed that may contain a tin and lead salt of a fluorine containing mineral acid, a fluorine containing mineral acid sufficient to provide a pH varying up to 1, and a sulfur containing complexing agent such as thiourea. An example of a tin-lead plating solution is given though it is believed that thick, reflowable deposits of tin and lead are not obtained and the compositions are believed to be unsuitable for the circuit fabrication.

In copending U.S. patent application Ser. No. 07/532,819, now abandoned, filed Jun. 4, 1990 assigned to the assignee hereof and incorporated herein by reference (hereafter the "copending application"), an immersion plating solution is disclosed capable of plating a thick tin-lead alloy deposit capable of reflow at a temperature of below about 500° F. The invention of the copending application was based upon a combination of discoveries. One such discovery was that to reflow a deposit, it was necessary that the deposit be porous and have a thickness of at least 100 microinches. Another discovery was the realization that to obtain a thick deposit capable of reflow, it was necessary to use a solution favoring a porous structure rather than a dense deposit. To obtain such a deposit, an immersion plating solution containing a relatively high metal content was used - i.e., preferably in excess of 0.10 moles per liter of total metal with a tin to lead ratio of at least 1 to 1. Further, both the tin salt and the lead salt, and preferably the acid used to provide a desired pH, all had a fluorine containing anion. In addition, recognizing that the displacement reaction favored tin, a lead promoter was added to solution to maintain a desired concentration of lead relative to tin and to obtain a thick deposit. Finally, to obtain as thick a deposit as possible, exaltants were added to the formulation.

Regardless of the immersion plating solution used, an immersion deposit should adhere firmly to the underlying substrate to prevent delamination during use. In practice, it has been found that over the useful life of a tin lead immersion plating solution such as that of the copending application, adhesion of the immersion deposit to its underlying substrate decreased. Therefore, it is desirable to find a means for preventing this decrease in adhesion.

SUMMARY OF THE INVENTION

During displacement plating, the concentrations and ratios of solution components change. For example, plating metal content changes as the metal is plated onto a substrate and replenished. At the same time, substrate metal content increases, typically from zero to a significant concentration as the substrate metal enters the plating solution as a consequence of the displacement reaction. Complexing agent, which is used in solution primarily to maintain the solubility of the metal content, changes in concentration due to decomposition and drag out as parts pass through the solution. Consequently, the concentration of complexing agent and total metals in solution changes with use of the solution as does the ratio of these components to each other.

It is one discovery of this invention that the ratio of the complexing agent to total metal content of an immersion tin-lead plating solution influences adhesion of a metal deposit to its underlying substrate. It is another discovery of this invention that there is an optimum ratio of complexing agent to total metals in the immersion plating solution for optimum adhesion of the metal deposit to its underlying substrate. Finally, it is an additional discovery of this invention that as the immersion plating solution is used, the optimum molar ratio of complexing agent to total metal content in solution should decrease while the weight ratio preferably remains about constant.

To practice the process of the invention, the plating solution is replenished with solution components periodically or continuously during use. One of the solution components added to the plating solution should be the complexing agent for the dissolved metals in solution where the amount of complexing agent added is that amount necessary to maintain the aforesaid ratio of total complexing agent to total dissolved metal. Another component to be replenished comprises metals to be plated from solution.

Based upon the above discoveries, and replenishment procedures as described above, one object of this invention is to provide a process comprising replenishment of an immersion tin-lead plating solution during its use to replenish consumed metals plus complexing agent whereby the ratio of the complexing agent to total metals contained in solution is optimized to maximize adhesion of a plated metal deposit to its underlying substrate. Another object of this invention is to provide an immersion plating solution for tin and lead optimized in its content of complexing agent and total metal content to maximize adhesion of the plated metal to its underlying substrate.

DESCRIPTION OF THE DRAWING

The drawing comprises a series of three graphs where graph 1 represents the molar concentration of complexing agent relative to total metal content in a plating solution in accordance with the most preferred embodiment of the invention; graph 2 represents the maximum molar concentration of complexing agent relative to total metal content in a plating solution in accordance with the invention; and graph 3 represents concentration of complexing agent relative to total metal content in a plating solution within a desired range initially and falling outside of a desired range during use of the solution. The area between the graphs 1 and 2 represents relative concentrations where deposit adhesion will vary from good closest to graph 1 to poor closest to graph 2.

DESCRIPTION OF THE PREFERRED EMBODIMENTS

In accordance with the invention disclosed herein, an immersion tin-lead alloy is deposited on a substrate in conventional manner using pretreatment steps and deposition procedures known in the art or a novel deposition sequence as disclosed herein. The immersion deposit is preferably deposited to a thickness in excess of 100 microinches to assist reflow following the procedures of this invention. The preferred immersion deposit is plated from plating solutions such as those disclosed in the copending application referenced above though the procedures of this invention are also applicable to immersion tin-lead plating from other immersion plating solutions.

A preferred tin-lead alloy plating solution for use in the process of the invention as disclosed in the copending application has the following composition at make-up:

TABLE I

| Component | Broad Range | Preferred Range |
|---|---|---|
| $Sn^{++}$ | 0.05 to 0.50 moles/liter | 0.10 to 0.30 moles/liter |
| $Pb^{++}$ | 0.01 to 0.15 | 0.02 to 0.10 |

TABLE I-continued

| Component | Broad Range | Preferred Range |
|---|---|---|
| | moles/liter | moles/liter |
| $Sn^{++} + Pb^{++}$ | 0.05 to 0.60 moles/liter | 0.12 to 0.35 moles/liter |
| Mole Ratio $Sn^{++}:Pb^{++}$ | 1.0:3.0 to 50.0:1.0 | 1.0:1.0 to 10.0:1.0 |
| Complexing agent | 0.05 to 2.50 moles/liter | 0.50 to 2.00 moles/liter |
| Lead Promoter | 0.00 to 0.60 moles/liter | 0.05 to 0.25 moles/liter |
| pH controller | to pH 0 to 1.5 | to pH 0 to 1.2 |
| Thickness promoter | 0.00 to 1.00 moles/liter | 0.001 to 0.20 moles/liter |
| Buffer | to maintain pH | to maintain pH |
| Water | to 1 liter | to 1 liter |

The stannous and plumbous ions are provided to the bath in the form of a solution soluble salt, preferably of a fluorine containing acid. Suitable sources of the salts include tin and lead fluorides, fluoborates or fluosilicates. Preferred sources for both are their respective fluoborate salts. The concentrations of tin and lead in solution are given in Table I. These concentrations are believed to be high compared to those which are known in the art. The high concentration contributes to a rapid rate of deposition and a porous deposit having a thickness prior to reflow of at least 100 microinches. A thick deposit promotes reflow and is desirable for surface mounting of components to the board. The ratio of the tin to lead ions is also given in Table I. This ratio permits deposition of alloys with tin ranging between 50 and 82 percent and lead ranging between 50 and 18 percent. The preferred solutions deposit alloys with tin ranging between about 56 and 74 percent and lead ranging between 44 and 26 percent. The alloy deposits have a multi-layered structure with a tin rich layer at the interfaces with copper and air and lead rich and tin rich intermediate layers.

The plating solutions contain a complexing agent in an amount at least sufficient to complex all of the metal in solution and preferably in an amount in excess of the amount required for complete complexation of all metal present in solution. The broad and preferred ranges for the concentration of the complexing agent are given in Table I and the ratio of complexing agent to total metal content of the plating solution in accordance with the invention is as described below. The complexing agent used is one preferably capable of complexing both tin and lead ions as well as copper ions though a separate complexing agent for copper compatible with the deposition solution can be used. Sulfur-containing complexing agents are preferred, especially a compound containing sulfur and nitrogen such as thiourea or thiourea compounds such as allyl thiourea or a thiourea substituted with a alkyl group such as tetramethyl thiourea.

Tin plates from solution at a more rapid rate than lead. To avoid deposition of an alloy with an undesirably high tin content, a component is added to the plating solution that promotes the rate of lead deposition relative to tin by changing the displacement potential of each. Suitable lead promoters include hypophosphorous acid, sodium hypophosphite, glycerin, urea, amino acetic acid, etc. Hypophosphorous acid is preferred. The concentration of the lead promoter is given in Table I. Though ranges are given, the relative rate of codeposition of tin and lead is subject to variables such as solution pH, solution temperature and the total combined metals content of the solution.

The immersion plating solutions are acidic and have a pH ranging up to about 2. Any mineral acid may be used to acidify the solution, but desirably, the acid has an anion common to the acid salts of tin and lead. Therefore, fluorine containing acids such as hydrofluoric acid, fluoboric acid and fluosilic acid are suitable with fluoboric acid being most preferred.

A thickness promoter is used in the immersion plating solution. Solution soluble salts of a metal of the Group IVb, Vb or VIb of the periodic table of the elements are suitable. Such metals include molybdenum, zirconium, titanium, chromium, vanadium, etc. Titanium added in the form of titanium trichloride dissolved in hydrochloric acid constitutes a preferred thickness promoter. The titanium ion concentration is given in Table I.

Chloride ion is another desirable additive in solution to promote deposit thickness. The chloride ion concentration preferably varies between 0 and 0.5 moles per liter and more preferably, between 0.0001 and 0.20 moles per liter.

An additional desirable component in the solution is a fluorine containing acid, and preferably fluoboric acid in minor amount sufficient to provide the required pH as set forth in Table I.

In addition to the above solution components, a limited amount of dissolved copper enters the solution through displacement plating where copper metal dissolves and is replaced by the plated metal. In this respect, the dissolved copper content is typically at least 0.01 moles per liter of solution and often varies up to in excess of 0.30 moles or more per liter over the life of the plating solution. For example, it has been found that after about 70 percent of a plating cycle of use of the preferred immersion tin lead plating solutions of the invention (a cycle is defined herein as plating of 100 percent of the tin originally present in solution), copper content is typically increased to about 0.25 moles per liter.

Another immersion tin-lead immersion deposit that can be operated in accordance with the invention disclosed herein is disclosed in Re. 30,434, reissued Nov. 11, 1980, and incorporated herein by reference. A preferred immersion depositing solution, in accordance with this patent comprises stannous chloride in a preferred amount of from 20 to 40 grams per liter, lead chloride in an amount of from 2 to 15 grams per liter, sodium hypophosphite in an amount of from 10 to 100 grams per liter, thiourea in an amount of from 40 to 100 grams per liter, hydrochloric acid in an amount of from 40 to 100 grams per liter and gelatin in an amount of from 1 to 4 grams per liter.

With the exception of the process for replenishment first taught herein, the immersion plating solutions may be used in conventional manner. A substrate having a cupreous surface is prepared for deposition by cleaning and etching the cupreous metal with an etchant such as an ammonium bifluoride - hydrogen peroxide etchant, a sodium persulfate - sulfuric acid etchant or a hydrogen peroxide - sulfuric acid etchant. Thereafter, following procedures believed not to be known to the art, the substrate may then be treated with a buffer solution which contains components common to those contained in the immersion plating solution to maintain pH, to maintain certain components within a desired concentration range and to prevent drag in of undesirable components into the immersion plating solution. For example, the buffer solution may contain complexing agents, a lead promoter, pH adjustors, thickness promoters, buffers, etc. After treatment with the buffer solution, the substrate is then contacted with the immersion plating solution, preferably without an intermediate water rinse.

The substrate is then immersed in the tin-lead immersion plating solution for a time sufficient to form a tin-lead deposit having a thickness of at least 100 microinches and preferably ranging between 150 and 350 microinches. Typically, the plating time required to obtain such a deposit is between about 5 and 30 minutes. As is known in the art, plating temperature affects the rate of deposition and deposit thickness. Plating temperatures typically range from about room temperature to close to the boiling point of the plating solution but temperatures of from about 100° F. to about 175° F. are typical.

Using the plating solutions of the copending application referenced above, the deposits formed are porous and matte gray in color with observable reflective crystals dispersed throughout the deposit. Deposits having the visible reflective crystals are readily reflowed. The deposits are non homogeneous and are known to be layered as described above.

The next step in the process may comprise deposition of immersion tin over the tin-lead alloy deposit. The deposition of tin is a step believed to be novel. Deposition of tin may be by any method known to those skilled in the art and formulations for depositing tin are disclosed in the literature. For example, immersion deposition of tin is disclosed in U.S. Pat. Nos. 3,303,029; 4,234,631; 4,657,632; and 4,882,202, all incorporated herein by reference. An electroless method for depositing tin is disclosed in U.S. Pat. No. 4,269,625, incorporated herein by reference. An electroplating formulation for depositing tin as well as tin-lead alloys is disclosed in U.S. Pat. No. 4,599,149, incorporated herein by reference. Of the various methods known to the art for depositing tin on a substrate, immersion deposition is preferred and those immersion depositing solutions disclosed in U.S. Pat. No. 3,303,029 are most preferred. Deposition time may range from 30 seconds to 30 minutes though shorter deposition times are preferred. The step of depositing tin may take place at any time subsequent to formation of the immersion tin-lead deposit though preferably immediately prior to reflow.

With or without deposition of tin, the immersion tin-lead deposit is reflowed in conventional manner if it is capable of reflow. Reflow involves heating the alloy above its melting point and holding the alloy at this temperature for a short period of time, typically for less than one minute. A preferred method involves floating a part or immersing a part with the tin-lead deposit on or in hot oil. Prior to reflow, the part is preferably warmed and following reflow, the part is preferably quenched at elevated temperature, all in accordance with conventional practice in the art. It is a characteristic of the tin-lead deposit that deposits having a thickness of less than about 100 microinches are difficult to reflow. In addition, it is believed that prior to the invention disclosed herein and that of the copending application referenced above, immersion deposits of lead and tin capable of reflow were not in commercial use and may not have been known in the art. Reflow is critical to the manufacture of circuit boards.

In the above described process for depositing tin-lead alloys on a substrate, as is known in the art, solution components are consumed during use of the plating solution. Consumption of solution components takes place through a combination of mechanisms. Tin and lead are consumed primarily by deposition of the metals onto the substrate. Tin, lead and all other solution components are consumed by solution drag-out, i.e., the retention of solution on the surface of parts as they are passed through the plating solution. Other components, including complexing agents, are often consumed by decomposition at the operating temperature of the plating solution. Though solution components are consumed during use of the plating solution, dissolved copper content in the plating solution increases through displacement of lead and tin for copper on the substrate to be plated. Consequently, during use of the plating solution, solution components are consumed while copper content increases.

The conventional practice in the art is to periodically or continuously add (replenish) consumed components to the bath, typically in amounts equal to their consumption. In accordance with the subject invention, consumed components are added in an amount approximating their rate of consumption with exception of the complexing agent which is replenished in an amount sufficient to maintain an optimum molar ratio of complexing agent to total metal content suitable to maintain deposition and a strong adhesive bond between the immersion metal deposit and the underlying substrate. Recognizing that consumed metals are replenished during use of the bath, but displaced metal content from the plated substrate increases during use of the bath, it should be understood that the total metal content of the displacement plating solution increases during its useful life. In this respect, during the useful life of a preferred tin-lead plating solution, the copper content may increase from essentially 0 to in excess of 0.30 moles per liter. In practice, it has been unexpectedly found that the optimum molar ratio of complexing agent to total metal content decreases as the total metal content of the bath increases. In other words, the optimum molar ratio of complexing agent for a fresh bath (essentially free of displaced metal) is higher than for a used bath containing a considerable content of displaced metal. This is unexpected because as metal content increases, sufficient complexing agent should be needed to maintain the molar ratio of complexing agent to metal relatively constant and sufficient to hold the metal in solution.

For purposes of the invention, the amount of complexing agent in a fresh solution and during its use is that amount necessary to hold the metal in solution while permitting plating to take place at an acceptable plating rate. The maximum amount of complexing agent in solution at any point during the useful life of the plating solution can be expressed by the following equation:

$$Y = 3.47X + 0.63$$

Y is the total moles of complexing agent in solution and X is the total moles of metal in solution inclusive of the tin, lead and copper. This equation is graphically depicted in graph 2 of the drawing.

In a preferred embodiment of the invention, the optimum amount of complexing agent in solution at any point during the useful life of the plating solution can be expressed by the following equation:

$$Y = 3.49X + 0.46$$

where X and Y are defined as above. This equation is graphically depicted in graph 1 of the drawing.

A comparison of graph 2 of the drawing with graph 1 compares the maximum concentration of complexing agent with the preferred concentration of complexing agent during about 70 percent of a plating cycle.

Replenishment of a plating bath can take place at any time during its use and can be by batch addition of bath constituents or by continuous addition. The practice most frequently used in production involves a batch addition of replenishers when the plating metal content decreases from its original content by a given proportion. For baths of the type contemplated herein, it is desirable to replenish the bath as solution components are depleted. Replenishment can take place continuously in which case replenishers would be added as frequently as when the bath is depleted by as much as 0.01 weight percent of the initial plating metals. If not replenished continuously, replenishment should take place as often as possible, preferably when the bath is depleted by from 0.005 to 25 weight percent of the initial plating metals and more preferably, when the bath is depleted by from 0.05 to 6 weight percent of the initial plating metals. Replenishment comprises replacement of the metals plated, addition of adequate complexing agent to maintain the optimum ratios of complexing agent to total metals as discussed above and addition of other bath components consumed or lost during the plating cycle. The complexing agent used for replenishment is preferably the same complexing agent used for solution make-up and is one capable of complexing all metals in solution. The sulfur containing complexing agents are preferred, thiourea being most preferred. In a lesser preferred embodiment of the invention, mixtures of complexing agents may be used such as a thiourea and a copper complexer compatible with the acidic pH of the solution.

Aside from the concentration of complexing agent added through replenishment, the method of replenishing is conventional and does not constitute a part of the invention. For example, replenishers can be added separately or combined, preferably in the form of solutions. A replenishment schedule can be based upon periodic titration of the solution for solution components with periodic replenishment or may be automated based upon plating conditions with periodic or continuous addition of solution components.

The invention will be better understood by reference to the examples that follow:

EXAMPLE 1

The following immersion tin-lead solution was used for purposes of illustration. Solution components are in moles per liter of aqueous solution unless otherwise indicated. Plating conditions are set forth in the example. The solution used is a freshly made up solution.

| | |
|---|---|
| Stannous fluoborate | 0.152 |
| Plumbous fluoborate | 0.035 |
| Fluoboric acid | 0.050 (to pH 0.8) |
| Thiourea | 1.120 |
| Hypophosphorous acid | 0.130 |
| Boric acid | 0.100 |
| Titanium trichloride | 0.006 |
| Hydrochloric acid | 0.0014 |
| Dissolved copper | 0.0001 |
| Solution pH | 0.8 |
| Plating temperature | 71.0° C. |

Copper clad epoxy glass laminate was prepared for plating by immersion in an acid soak cleaner followed by immersion in a mild acid copper etching solution, a peroxide-sulfuric acid microetch, an acid activator and a fluoboric acid pre-dip with water rinsing after each treatment except for the fluoboric acid pre-dip. Parts are then immersed into the plating solution for a period of 8 minutes. Deposit thicknesses are about 225 microinches and are matte gray with reflective crystals readily observable. The alloy deposit has a multi-layered structure with a tin rich layer at the interfaces with copper and air and lead rich and tin rich intermediate layers. The immersion deposits formed are firmly adhered to their underlying substrates. The deposits are reflowed by fluxing, warming at 250° F. in oil for about 20 seconds, reflowed in hot oil at 400° F. for 20 seconds and quenched in oil at 250° F. The parts are then rinsed, cleaned and dried and typically found to contain 67 percent by weight tin and 33 percent by weight lead, a composition close to the tin-lead solder eutectic. The deposits are firmly adherent to the substrate as determined by a tape test where Scotch Brand 610 tape is applied to the deposit rubbed over the deposit to firmly adhere the tape to its surface. It is then rapidly pulled from the deposit. If the deposit does not separate from the underlying substrate, the deposit is considered to be 100 percent adhered to the surface and is considered to have passed the test. The aforesaid test is then repeated several times in the same location.

The molar ratio of the thiourea to tin and lead in a fresh solution for the above formulation is about 6.0 to 1. The solution is capable of continuous use until in excess of 13 grams of tin and an appropriate amount of lead to form the desired solder deposit have been plated from solution. With periodic replenishment of components, the solution can be used to plate about 20 square feet of surface area per gallon of plating bath to a deposit thickness of 225 microinches. As plating continues over the useful life of the solution, the copper content in solution will build to about 17 grams per liter (0.26 moles) and thiourea will be added to bring the total concentration of thiourea to about 158 grams per liter (2.03 Moles) of solution. If Example 1 is periodically replenished with thiourea during the life of the solution whereby the molar ratio of thiourea to total metals decreases from 6.0 to 1 for a fresh solution to about 4.5 to 1 for a solution containing about 17 grams of dissolved copper per liter, the deposits will continue to pass the tape test and be firmly adherent to the underlying substrate. The decrease in the ratio of complexing agent to total metals is linear with the increase in total metal content. The results of this experiment are represented in graph 1 of the drawings.

EXAMPLE 2

The procedure of Example 1 is repeated except that the molar ratio of thiourea to total metal changes between 7 to 1 and 5 to 1 during use of the solution. In this instance, adhesion between the deposit and underlying substrate is less than 100% during use of the solution. The results of this experiment are depicted in graph 2 of the drawing.

EXAMPLE 3

The procedure of Example 1 is repeated except that the molar ratio of thiourea to total metal is maintained between 6 to 1 and 5 to 1 throughout use of the solution. The results of this experiment are depicted in graph 3 of the drawing. In this instance, adhesion between the deposit and the underlying substrate worsened during use of the solution as the copper content increased to 12 grams per liter at which point, adhesion was 0. Adhesion was 100% at point 1 on graph 3. Thereafter, adhesion decreased continuously with use of the solution. Adhesion failure can be roughly predicted by use of graphs 2 and 3 where failure should occur close to the point where graph 3 intersects graph 2.

We claim:

1. A process for replenishing a tin-lead immersion plating solution during use of the same, said process comprising the steps of passing cupreous substrates through solution to displace copper from the substrate with tin and lead from solution and periodically replenishing the solution by adding tin and lead salts to replace those removed from solution by the plating reaction and one or more complexing agents to the plating solution in an amount whereby the total concentration of dissolved tin, lead and copper increases with use of the solution and the molar ratio of complexing agent to total metals dissolved in solution decreases as the total metal content of the solution increases.

2. The process of claim 1 where the complexing agent is added in an amount whereby the total concentration of complexing agent in solution varies in an amount between that amount sufficient to maintain the plating reaction and to maintain all metals dissolved in solution and a maximum defined by the equation:

$$Y + 3.47X + 0.63$$

where Y is the total concentration of complexing agent expressed in moles per liter and X is the total concentration of dissolved metal expressed in moles per liter.

3. The process of claim 2 where the complexing agent is added in an amount whereby the molar ratio of complexing agent to total metal content in solution does not exceed 7.0 to 1.

4. The process of claim 3 where the ratio decreases from about 7.0 to 1 to about 4.0 to 1 during the useful life of the solution.

5. The process of claim 1 where the total concentration of the complexing agent in solution is approximately that amount defined by the equation:

$$Y = 3.49X + 0.46$$

where Y is the total concentration of complexing agent expressed in moles per liter and X is the total concentration of dissolved metal expressed in moles per liter.

6. The process of claim 2 where the complexing agent is thiourea,

7. The process of claim 2 where the copper content of the solution during its use does not exceed about 0.30 moles per liter.

8. A process for plating a tin-lead immersion deposit from solution onto a cupreous surface by displacement plating from a solution containing stannous ions in an amount of from 0.05 to 0.50 moles per liter, plumbous ions in an amount of from 0.01 to 0.15 moles per liter, a total content of stannous ions and plumbous ions in an amount of from 0.06 to 0.60 moles per liter and a ratio of stannous ions to plumbous ions varying from about 1.0:3.0 to 50.0:1.0, said process comprising the step of periodically adding one or more complexing agents to the plating solution in an amount whereby the molar ratio of complexing agent to total metals dissolved in solution decreases as the total metal content dissolved in solution increases.

9. The process of claim 8 where the displacement plating solution contains stannous ions in an amount of from 0.10 to 0.30 moles per liter, plumbous ions are in an amount of from 0.02 to 0.10 moles per liter, the total content of stannous ions and plumbous ions ranges from 0.12 to 0.35 moles per liter, the ratio of stannous ions to plumbous ions varies from about 1.0:1.0 to 10.0:1.0 and copper ions in solution increase in concentration from about 0 in a fresh solution to about 0.25 moles during the useful life of the solution.

10. The process of claim 9 where the complexing agent is added in an amount whereby the total concentration of complexing agent in solution varies from that amount necessary to maintain the plating reaction and all dissolved metals in solution and a high defined by the equation:

$$Y = 3.47X + 0.63$$

where Y is the total concentration of complexing agent expressed in moles per liter and X is the total concentration of dissolved metal expressed in moles per liter.

11. The process of claim 8 where the complexing agent is added in an amount whereby the molar ratio of complexing agent to total metal content in solution does not exceed 7.0 to 1.

12. The process of claim 11 where the ratio decreases from 6.5 to 1 to about 4.5 to 1 during the useful life of the solution.

13. The process of claim 11 where the ratio decreases from about 6.5 to 1 to about 4.5 to 1 during in excess of one half of a plating cycle.

14. The process of claim 13 where the complexing agent is thiourea.

* * * * *